(12) United States Patent
Kundner et al.

(10) Patent No.: US 11,378,631 B2
(45) Date of Patent: Jul. 5, 2022

(54) ADJUSTABLE MR LOCAL COIL

(71) Applicant: Siemens Healthcare GmbH, Erlangen (DE)

(72) Inventors: Thomas Kundner, Buckenhof (DE); Stephan Zink, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/568,212

(22) Filed: Sep. 11, 2019

(65) Prior Publication Data
US 2020/0081082 A1 Mar. 12, 2020

(30) Foreign Application Priority Data
Sep. 12, 2018 (DE) ...................... 10 2018 215 457.0

(51) Int. Cl.
*G01R 33/34* (2006.01)
*G01R 33/3415* (2006.01)

(52) U.S. Cl.
CPC ... *G01R 33/34084* (2013.01); *G01R 33/3415* (2013.01)

(58) Field of Classification Search
CPC .......... G01R 33/34084; G01R 33/3415; G01R 33/36; A61B 5/055
See application file for complete search history.

(56) References Cited

U.S. PATENT DOCUMENTS

| | | | |
|---|---|---|---|
| 6,046,585 A | 4/2000 | Simmonds | |
| 7,397,245 B2 * | 7/2008 | Wohlfarth | G01R 33/3415 324/318 |
| 2008/0007250 A1 * | 1/2008 | Wiggins | G01R 33/34084 324/200 |
| 2008/0007259 A1 | 1/2008 | Driemel | |
| 2013/0225980 A1 * | 8/2013 | Biber | G01R 33/34084 600/422 |
| 2014/0191757 A1 | 7/2014 | Randell | |
| 2014/0213886 A1 * | 7/2014 | Menon | G01R 33/285 600/411 |
| 2016/0220144 A1 | 8/2016 | Paul | |
| 2018/0263561 A1 * | 9/2018 | Jones | A61B 5/055 |
| 2019/0353722 A1 * | 11/2019 | Stormont | G01R 33/34007 |

FOREIGN PATENT DOCUMENTS

| | | |
|---|---|---|
| CN | 205246850 U | 5/2016 |
| CN | 105832330 A | 8/2016 |
| DE | 102006027189 A1 | 12/2007 |
| JP | 2003320035 A | 11/2003 |

OTHER PUBLICATIONS

German Office Action for German Application No. 10 2018 215 457.0 dated Jun. 11, 2019.
Chinese Office Action for Chinese Application No. 201910846829.6 dated Jun. 22, 2021.

* cited by examiner

*Primary Examiner* — Rishi R Patel
(74) *Attorney, Agent, or Firm* — Lempia Summerfield Katz LLC

(57) ABSTRACT

A magnetic resonance (MR) local coil and a magnetic resonance apparatus are provided. The MR local coil includes a plurality of substrates. At least one conductor loop is arranged on each substrate of the plurality of substrates. The plurality of substrates form a combined virtual surface. The plurality of substrates may be displaced with respect to one another tangentially to the virtual surface.

17 Claims, 8 Drawing Sheets

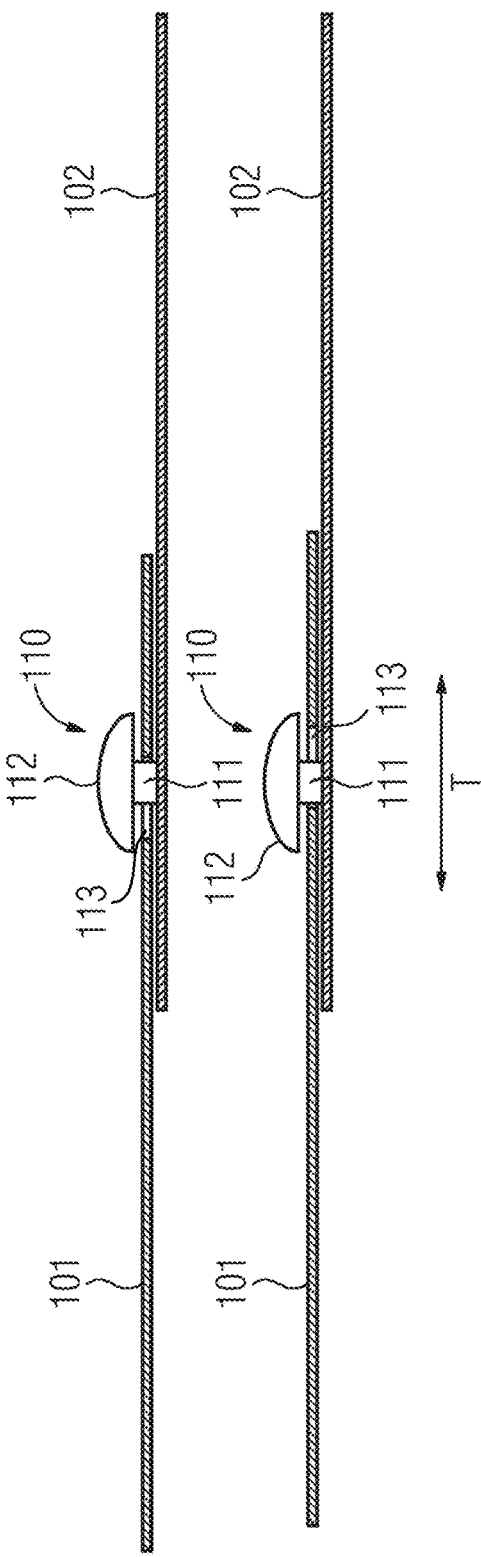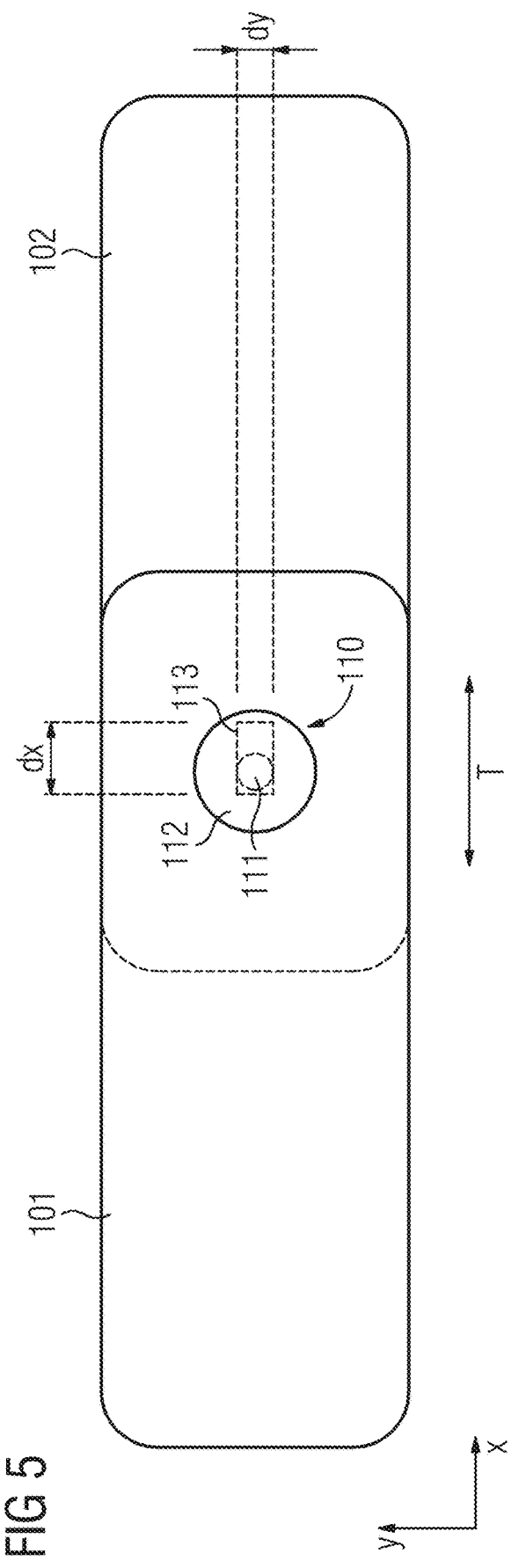

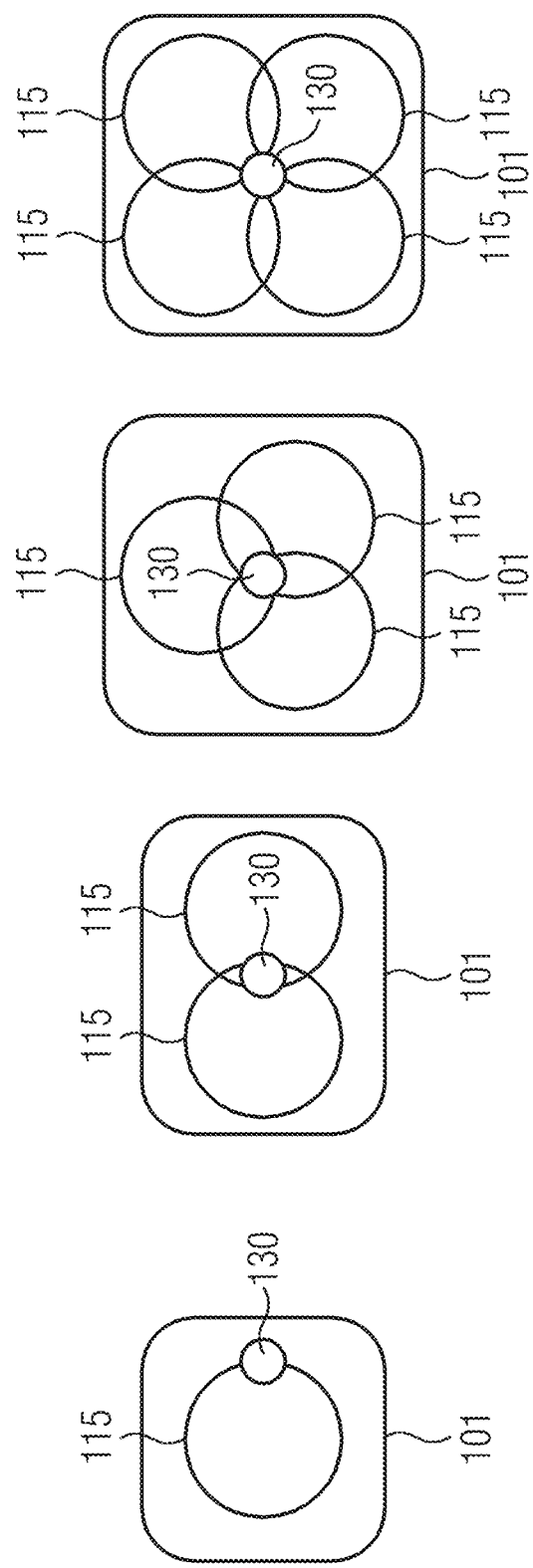

ADJUSTABLE MR LOCAL COIL

This application claims the benefit of DE 10 2018 215 457.0, filed on Sep. 12, 2018, which is hereby incorporated by reference in its entirety.

BACKGROUND

The present embodiments relate to a magnetic resonance (MR) local coil and to a magnetic resonance apparatus.

In medical technology, high and variable soft-tissue contrasts are a particular feature of imaging using MR, also known as magnetic resonance imaging (MRI). A magnetic resonance apparatus is used in this process to expose a subject under examination, usually a patient, to radiofrequency excitation pulses. This triggers magnetic resonance signals in the patient. The magnetic resonance signals are received as measurement data by the magnetic resonance apparatus and used to reconstruct magnetic resonance images.

The magnetic resonance signals are often received using MR local coils, otherwise known as surface coils. These may be antenna systems that are mounted in the immediate vicinity on (e.g., anterior) and/or under (e.g., posterior) the patient. Such an antenna system normally includes one or more electrical conductor loops, often also referred to as coil elements or antenna elements. In an MR measurement, the magnetic resonance signals induce in the individual conductor loops of the MR local coil a voltage that is read as measurement data and transferred to an analysis unit of the magnetic resonance apparatus for reconstructing magnetic resonance images.

It is a general objective when receiving magnetic resonance signals to bring the coil elements as close as possible to the patient in order to thereby achieve a maximum possible signal-to-noise ratio. Known solutions may be classified under rigid and flexible MR local coils.

Rigid MR local coils (e.g., for head examinations) seek to cover as high a proportion of the potential patient by having a best possible fit to the anatomy of the patient. For patients with small or intermediate anatomy dimensions, however, the optimum image quality is not achieved because the coil elements lie too far away from the patient.

Flexible conventional MR local coils may be adjusted to fit the anatomy of the patient, but only to a certain degree. For example, the adjustment manages to achieve only an inadequate fit to anatomies that are three-dimensional in form. For example, portions of the MR local coil may bulge and/or stick out.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the form-fitting capability of magnetic resonance (MR) local coils may be improved.

An MR local coil that includes a plurality of substrates is provided. At least one conductor loop is arranged on each substrate of the plurality of substrates. The plurality of substrates form a combined virtual surface. The MR local coil is configured to allow a displacement of the substrates with respect to one another tangential to the virtual surface. In other words, the substrates may be displaced with respect to one another tangentially to the virtual surface.

For example, the substrates are connected to one another such that a displacement of the substrates with respect to one another is possible tangential to the virtual surface.

A substrate may be a support material for the conductor loops (e.g., a planar support material). The conductor loops may be connected to the substrates fixedly and/or rigidly and/or over the surface. For example, the conductor loops are printed and/or glued onto the substrates. The conductor loops may be applied to the substrates, for example, on one side or on both sides. Conductor loops applied on both sides may be connected from one side to the other through vias in order to avoid short-circuits where two conductor loops cross over.

The substrates may be electrical insulators. The conductor loops may be electrical conductors. Electromagnetic signals may thereby induce an electrical voltage in the conductor loop.

For example, the substrates may be arranged in a two-dimensional array. The substrates (e.g., the surfaces of the substrates) may have a two-dimensional structure that is arranged parallel to the virtual surface of the substrates.

A normal vector at every point on the surface of the substrate may be parallel to a normal vector of the virtual surface at a projection point of this point on the surface of the substrate.

For example, the virtual surface may be flat or curved. The virtual surface may be a regular and/or differentiable surface, so that a tangential plane may be created at every position on the substrate surface. The virtual surface may have no corners and/or edges.

The real surfaces of the substrates definitely may have corners and/or edges. The virtual surface may be regarded, for example, as a theoretical and/or idealized two-dimensional geometrical object that may differ in detail from the real surfaces of the substrates. For example, the virtual surface may be regarded as a midplane of an envelope of the substrates.

The projections of the substrates (e.g., of the conductor loops) onto the virtual surface may overlap at least partially.

The substrates may be aligned parallel to one another in an overlap region of the projections of the substrates onto the virtual surface.

The substrates may be displaced with respect to one another tangentially to the virtual surface (e.g., the substrates may change relative position). The tangential displacement may be, for example, also a lateral displacement in the virtual surface or, more precisely, parallel to the virtual surface.

The possible displacement of the substrates may include, for example, a translation and/or a rotation of the substrates. A possible displacement of the substrates may include a component that may not be described by a rotation.

The possible displacement of two substrates with respect to one another may equal at least 5 mm A possible displacement of two substrates with respect to one another may equal at most 30 mm.

The ability of the substrates to be displaced tangentially provides it is possible to improve the three-dimensional form-fitting of the MR local coils because the substrates may be adjusted more flexibly by the freedom of movement facilitated by the displacement. The widest range of shapes and/or diameters of subjects under examination may be enclosed in an even closer fit.

For example, if an operator of a magnetic resonance apparatus positions the MR local coils on a patient, the substrates arrange themselves relative to one another advantageously by moving with respect to one another such that the conductor loops may be brought closer to the patient. Any measurement data that may be acquired by the conductor loops advantageously has a higher signal-to-noise ratio.

The improved form-fitting capability provides that the versatility in the use of the MR local coil may be increased (e.g., examination of both large and small knees, with and without bandage, other angles of joints, etc.). Functional imaging may be facilitated and/or improved.

With an MR local coil according to one or more of the present embodiments, the pressure arising in form-fitting to a subject is directed less onto the substrate material compared with a conventional MR local coil having a continuous substrate, and instead is diverted onto the displaceable regions. One possible advantage is that of reducing the risk of conductor-loop breakages.

According to another embodiment of the MR local coil, at least one of the substrates includes two or more conductor loops. Each substrate may include three to four conductor loops. A plurality of conductor loops on one substrate may thus form a cluster of conductor loops. A plurality of clusters may form an antenna array. The surface area of a substrate may be between 50 and 3000 $cm^2$ (e.g., between 100 and 500 $cm^2$).

By combining a plurality of conductor loops on one substrate (e.g., forming a cluster), more space may be provided for the possible displacement, thereby increasing the length of the possible displacement between two adjacent substrates.

Each substrate may include at most twelve conductor loops (e.g., at most six conductor loops). Typically, as the number of conductor loops on one substrate increases, so too does the size of the substrate, which may impair the form-fitting capability of the overall system.

According to another embodiment of the MR local coil, the substrates and/or the conductor loops are bendable. The substrates and/or the conductor loops may be reversibly bendable and/or bendable in a non-destructive manner. The substrate may consist of one or more flexible materials. The substrate may be sufficiently thin (e.g., between 50 to 300 µm) to be sufficiently able to bend. The ability of the substrate to bend provides that the MR local coil may better fit the form of the subject under examination.

The shape of the virtual surface to which the possible tangential displacement of the substrates relates obviously also changes depending on the bend condition of the substrates.

The substrates may not expand tangentially to the virtual surface. This allows better control over the ability of the substrates to be displaced tangentially to the virtual surface.

According to another embodiment of the MR local coil, the substrates include a printed circuit board (PCB) material, such as FR4, PEN, PET and/or polyimide, for example. The substrates may consist of printed circuit board material. Printed circuit board material is favorable and may be processed with high precision, reproducibly, and in a fully automated manner. Printed circuit board material may be configured to be fire-proof without great expense (e.g., in accordance with fire safety classification UL-V0).

According to another embodiment of the MR local coil, the MR local coil includes a mechanism for restricting a possible displacement tangential to the virtual surface. This allows better control over the ability of the substrates to be displaced tangentially to the virtual surface.

According to another embodiment of the MR local coil, adjacent substrates are connected by at least one connecting device, which restricts a possible displacement of the substrates tangential to the virtual surface.

The connecting device may be used, for example, not only to connect substrates but also to provide control over the possible displacement.

According to another embodiment of the MR local coil, the at least one connecting device includes a connecting element that is fed through an opening in respective adjacent substrates.

The connecting element may be embodied, for example, as a pin, doubled-ended mushroom head, rivet, and/or snap-fastener. A potential advantage is that this makes possible a systematically adjustable, lateral displacement.

According to another embodiment of the MR local coil, at least one of the openings has a larger dimension in a first direction tangential to the virtual surface than in a direction that is orthogonal thereto and tangential to the virtual surface. For example, the opening may be oval or have the form of a slot.

One possible advantage is that it is thereby possible to improve and extend the control over the direction of the possible displacement tangential to the virtual surface.

According to another embodiment of the MR local coil, the MR local coil includes an enclosure that surrounds the substrates at least partially (e.g., entirely). For example, the substrates may be arranged inside the enclosure. One possible advantage of the enclosure is that the substrates including the conductor loops may be better protected.

According to another embodiment of the MR local coil, the enclosure restricts a possible displacement of the substrates tangential to the virtual surface. The encasement may be configured to provide at the same time, in addition to a corresponding protective function especially against mechanical damage, a restriction on the possible displacement of the substrates.

Another possible advantage may be that it is possible to dispense with any connecting device for restricting the possible displacement of the substrates.

According to another embodiment of the MR local coil, the enclosure includes a first layer and a second layer, which is arranged parallel to the virtual surface. The substrates are arranged between the first layer and the second layer. The first layer has a first edge, and the second layer has a second edge. The first edge and the second edge are joined together and form a combined edge.

The combined edge restricts a possible displacement of the substrates tangential to the virtual surface.

For example, the substrate may have an edge that, in a central position, is at a distance from the combined edge of the enclosure. A position in which the shortest distance of the edge of the substrate from a combined edge of the enclosure is at a maximum may be considered to be a central position, for example.

Proceeding from this central position, the substrate may then be displaced by this distance until the edge of the substrate touches the combined edge of the enclosure, whereby the displacement is restricted.

The combined edge of the enclosure may bound an aperture in the enclosure. The apertures in the enclosure then at the same time provide better air circulation. In addition, the weight of the MR local coil may be reduced by the aperture.

The substrate may also have an aperture that is larger in extent than the extent of the aperture in the enclosure. The difference in the extents then may define the distance of the edge of the combined edge of the enclosure from the edge of the substrate.

For example, if the aperture in the enclosure is in the shape of a circle of diameter D1, and the aperture in the substrate is in the shape of a circle of diameter D2<D1, and if the circles are arranged concentrically so that the substrate lies in a central position, then the edge of the substrate is at a distance (D1−D2)/2 from the combined edge of the enclosure. From this central position, the substrate, unless the substrate touches another obstacle (e.g., another edge), may be displaced by this distance as a maximum.

According to another embodiment of the MR local coil, at least two substrates have the same shape. The MR local coil may be produced more favorably by the repeated use of one substrate shape.

According to another embodiment of the MR local coil, an electronics unit is arranged at least on some of the substrates. The electronics unit may include a preamplifier, for example.

The electronics unit may be connected and/or coupled to a plurality of conductor loops of a substrate. The electronics as a whole may be bundled and/or pooled by these. This allows, for example, a larger number of apertures in the MR local coil and hence better air circulation.

A magnetic resonance apparatus including at least one MR local coil described above is also provided.

BRIEF DESCRIPTION OF THE DRAWINGS

Further advantages, features, and details of the invention appear in the exemplary embodiments described below and follow from the drawings. Corresponding parts are denoted by the same reference signs in all the figures, in which:

FIGS. 3-7 show various exemplary mechanisms for restricting a possible displacement;

FIG. 11 shows exemplary substrates having different numbers of electrical conductor loops.

DETAILED DESCRIPTION

Figure 1:
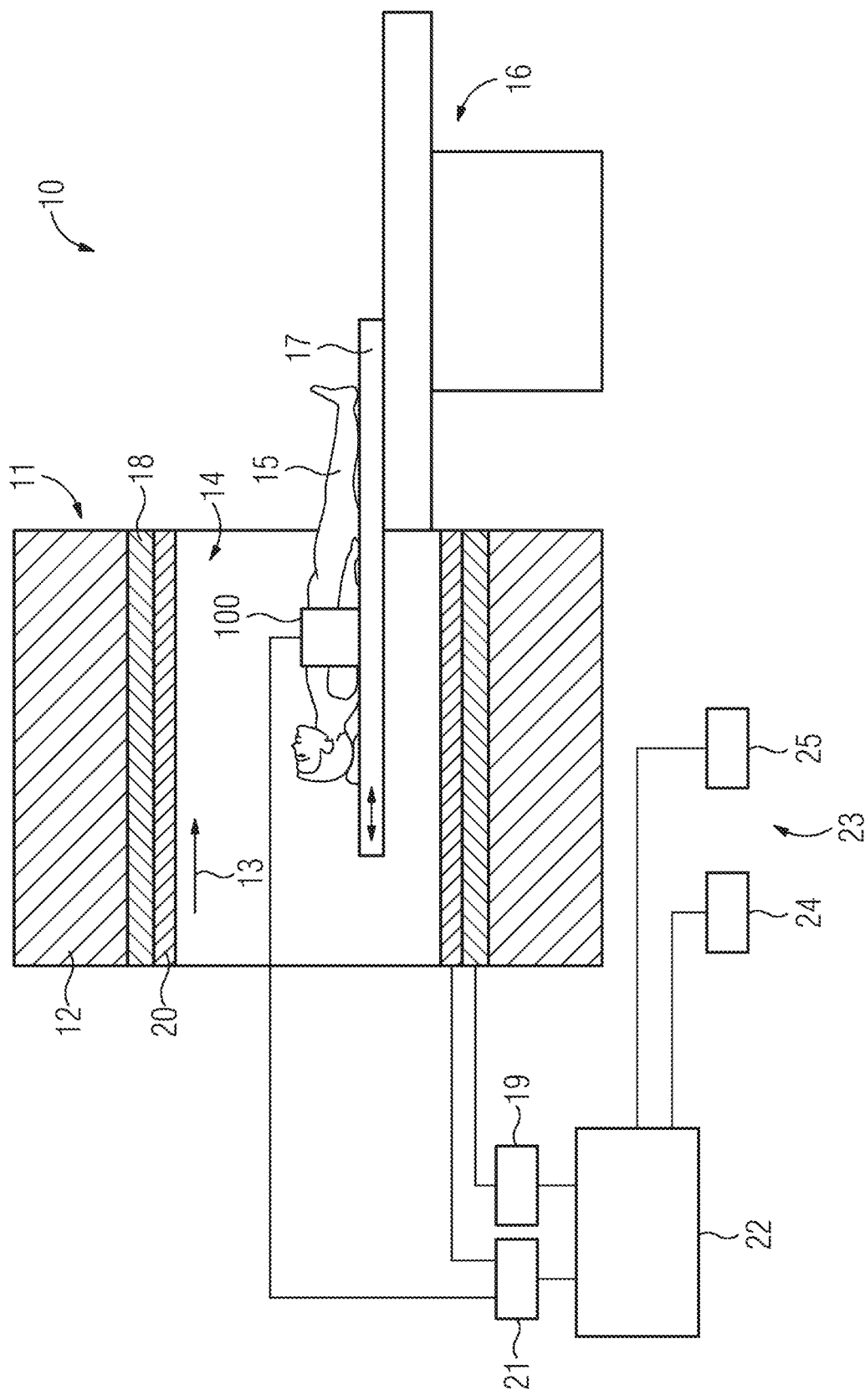
FIG. 1 shows one embodiment of a magnetic resonance (MR) apparatus including an MR local coil.

FIG. 1 schematically shows one embodiment of a magnetic resonance apparatus 10. The magnetic resonance apparatus 10 includes a magnet unit 11. The magnet unit 11 includes a main magnet 12 for producing a powerful main magnetic field 13 that is, for example, constant over time. The magnetic resonance apparatus 10 also includes a patient placement zone 14 for accommodating a patient 15. In the present exemplary embodiment, the patient placement zone 14 is shaped as a cylinder and is enclosed in a circumferential direction cylindrically by the magnet unit 11. In principle, however, the patient placement zone 14 may have a different design. The patient 15 may be moved into the patient placement zone 14 by a patient support apparatus 16 of the magnetic resonance apparatus 10. The patient support apparatus 16 includes for this purpose a patient couch 17 that is configured to be able to move inside the patient placement zone 14.

The magnet unit 11 further includes a gradient coil unit 18 for generating magnetic field gradients that are used for spatial encoding during imaging. The gradient coil unit 18 is controlled by a gradient control unit 19 of the magnetic resonance apparatus 10. The magnet unit 11 also includes a radiofrequency antenna unit 20 that, in the present exemplary embodiment, is configured as a body coil that is fixedly integrated in the magnetic resonance apparatus 10. The radiofrequency antenna unit 20 is configured to excite atomic nuclei. The excitation is established in the main magnetic field 13 and is produced by the main magnet 12. The radiofrequency antenna unit 20 is controlled by a radiofrequency antenna control unit 21 of the magnetic resonance apparatus 10 and radiates high-frequency magnetic resonance sequences into an examination space, which is largely formed by a patient placement zone 14 of the magnetic resonance apparatus 10. The radiofrequency antenna unit 20 is also configured to receive magnetic resonance signals.

The magnetic resonance apparatus 10 includes a system control unit 22 for controlling the main magnet 12, the gradient control unit 19, and the radiofrequency antenna control unit 21. The system control unit 22 centrally controls the magnetic resonance apparatus 10 (e.g., implementing a predetermined imaging gradient echo sequence). In addition, the system control unit 22 includes an analysis unit (not presented in further detail) for analyzing measurement data acquired during the magnetic resonance examination. In addition, the magnetic resonance apparatus 10 includes a user interface 23 that is connected to the system control unit 22. Control data such as imaging parameters, for example, and reconstructed magnetic resonance images may be displayed to medical personnel on a display unit 24 (e.g., on at least one monitor) of the user interface 23. In addition, the user interface 23 includes an input unit 25 that may be used by the medical operating personnel to enter data and/or parameters during a measurement process.

The magnetic resonance apparatus also includes an MR local coil 100 that is connected to the radiofrequency antenna control unit 21. The MR local coil 100 is configured to transmit radiofrequency signals (RF signal) and/or to receive magnetic resonance signals, and is described in greater detail, by way of example, with respect to the following figures.

Figure 2:
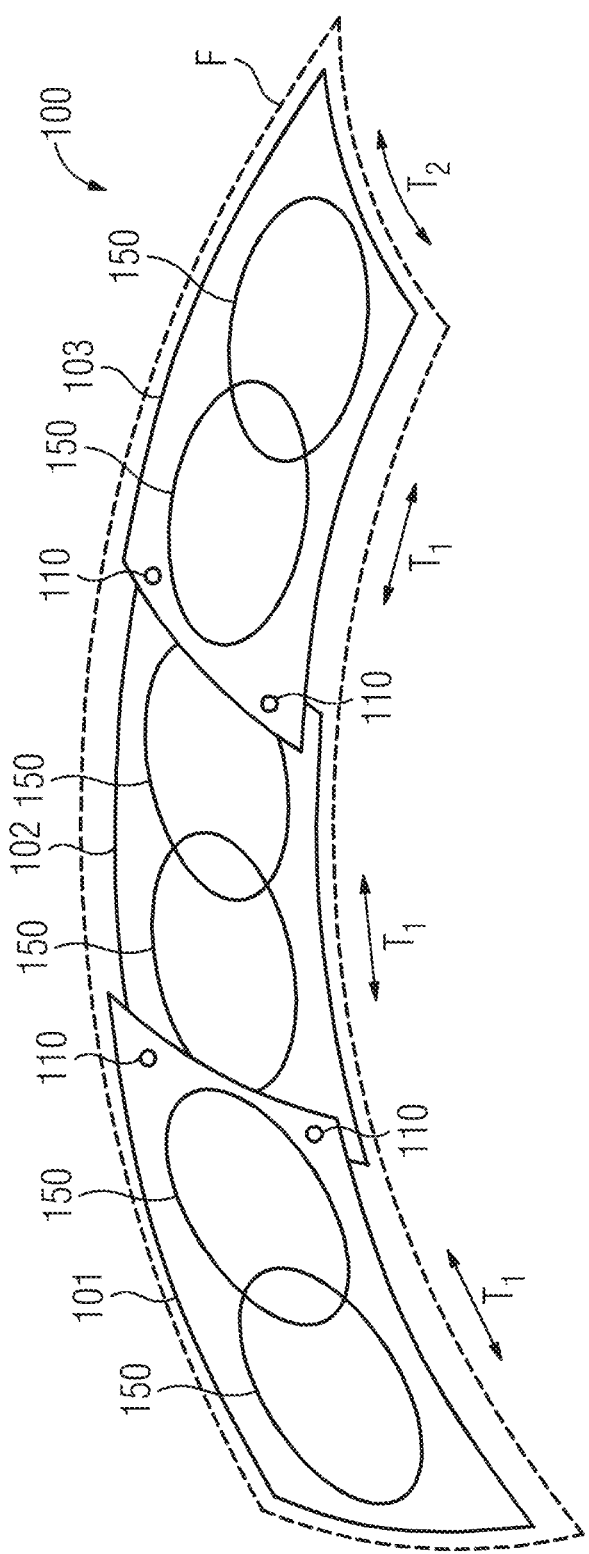
FIG. 2 shows one embodiment of an MR local coil having substrates that may be displaced with respect to one another.

FIG. 2 shows one embodiment of an MR local coil 100 having three substrates 101, 102, 103. Two conductor loops 150 are arranged on each of the substrates 101, 102, 103. The substrates 101, 102, 103 form a combined virtual surface F and may be displaced with respect to one another tangentially to this surface F. In this example, a possible displacement may take place along the direction $T_1$, along the direction $T_2$, or along a combination of both directions $T_1$ and $T_2$.

The projections onto the virtual surface F of the substrates 101 and 102 and of the substrates 102 and 103 respectively overlap in both cases. In addition, the projections of conductor loops 150 of adjacent substrates 101 and 102, and respectively 102 and 103, overlap.

The substrates 101, 102, 103 are bendable, for example, so that the substrates 101, 102, 103 may be taken reversibly from a flat state into the curved state, as shown in FIG. 2. To make this possible, the substrates 101, 102, 103 may consist of a thin printed circuit board material, for example.

The MR local coil 100 also includes a mechanism 110 for restricting a possible displacement tangential to the virtual surface F. The following figures explain in greater detail different variants of the mechanism 110.

Figure 3:
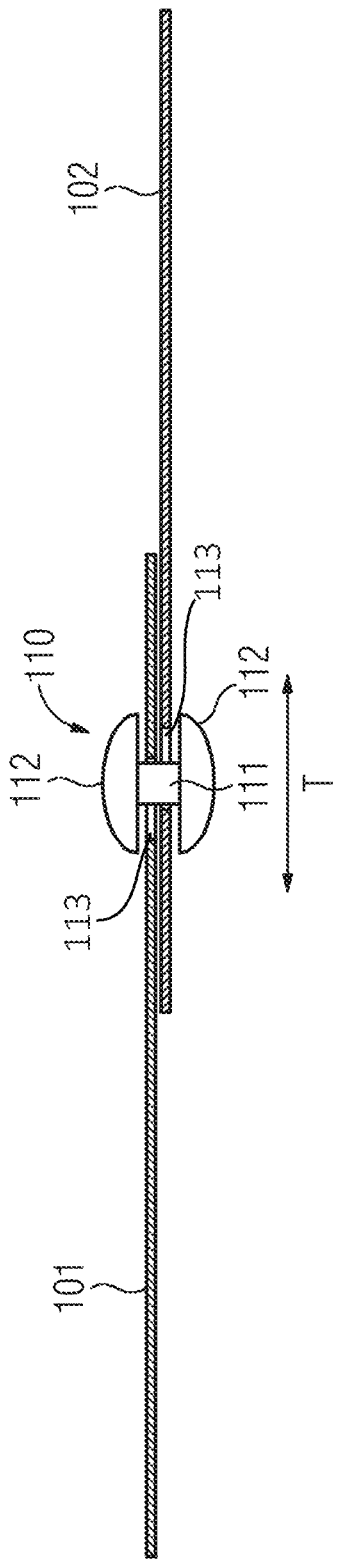

FIG. 3 shows two adjacent substrates 101, 102. The virtual surface extends in, for example, a horizontal direction (e.g., perpendicular to the drawing plane). The possible tangential displacement T of the substrates 101, 102 tangential to the virtual surface is restricted by a mechanism 110. This mechanism 110 serves at the same time to connect the substrates 101, 102 together (e.g., constitutes a possible connecting device).

The connecting device includes a connecting element in the form of a pin 111 that is fed through an opening 113 in each of the substrates 101, 102. In order to fix the pin on the substrates 101, 102, the connecting device also includes a mushroom head 112 at both ends of the pin.

The top substrate 101 may be displaced to the right, for example, until the left-hand edge of the opening 113 in this substrate 101 touches the pin 111. The bottom substrate 102 may be displaced to the left, for example, until the right-hand edge of the opening 113 in this substrate 102 touches the pin 111.

As shown in FIG. 4, the mechanism 110 may also include a pin 110 that is fastened at one end to a substrate 102 and is fed through an opening 113 in the substrate 101. In the top situation, the top substrate 101 is displaced with respect to the substrate 102 tangentially to the virtual surface, which again in this case, extends in a horizontal direction, to a maximum extent to the left, and in the bottom situation, to a maximum extent to the right.

FIG. 5 shows a plan view of two substrates 101, 102 that are connected via a mechanism for restricting the displacement of the substrates 101, 102 with respect to one another tangential to the virtual surface. The virtual surface extends, for example, in the drawing plane. The substrate has an opening 113 that has a larger dimension dx in the x-direction than the dimension dy in the y-direction, which is perpendicular thereto. The direction of the possible displacement tangential to the virtual surface may thus be set precisely.

Figure 6:
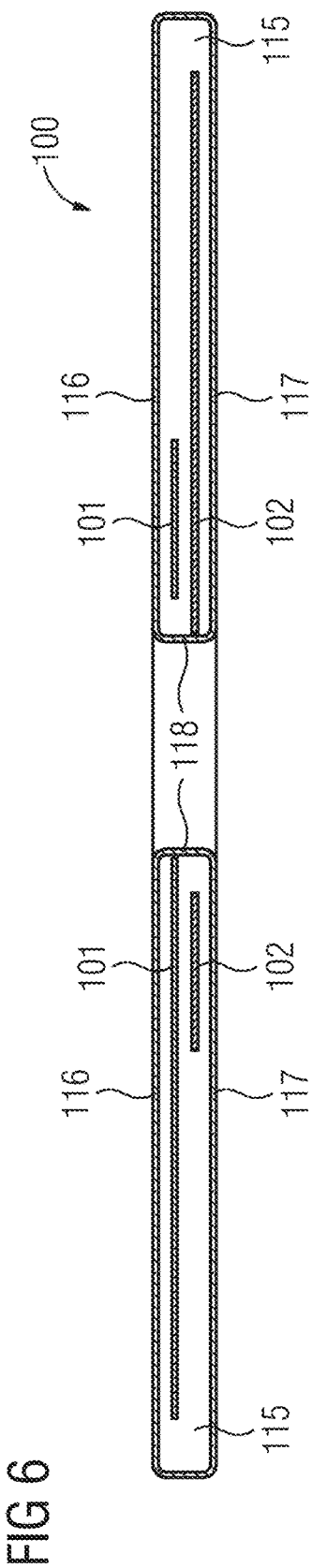
Figure 7:
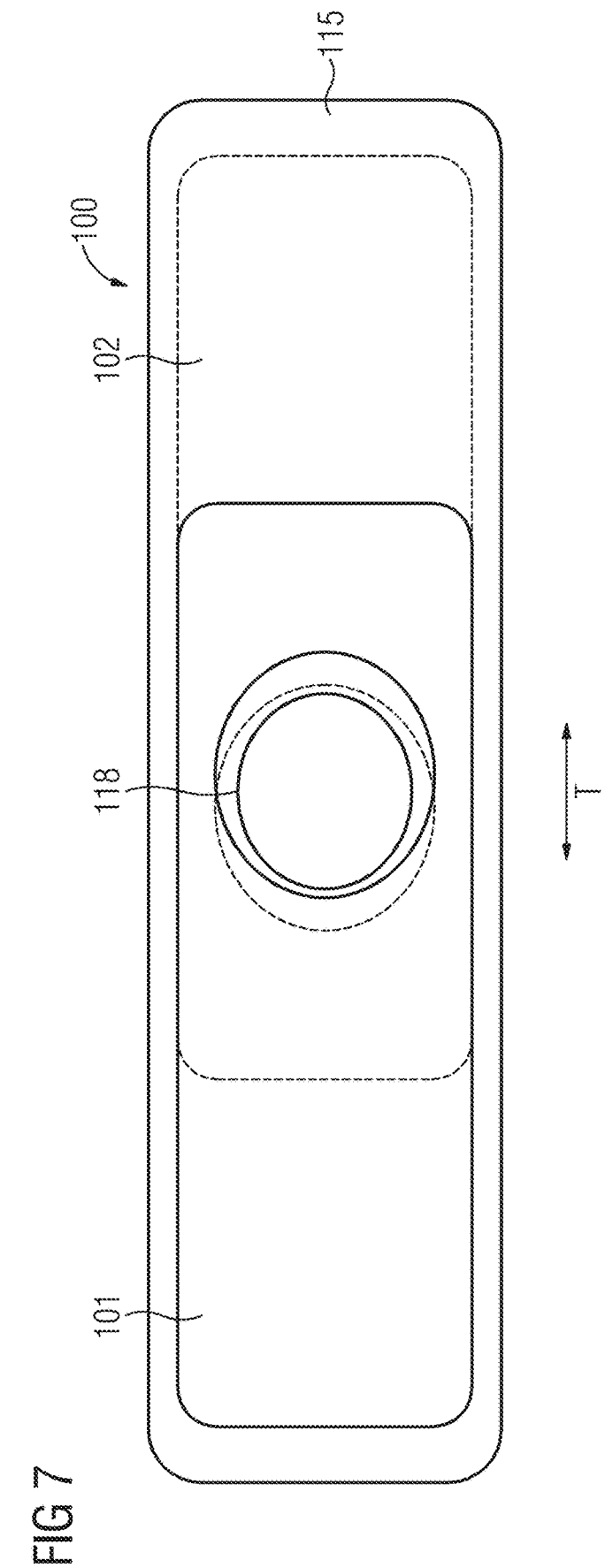

FIGS. 6 and 7 show one embodiment of an MR local coil 100 having an enclosure 115, in which the substrates 101, 102 are arranged. In this case, the enclosure 115 restricts a possible displacement of the substrates 101, 102 tangential to the virtual surface, which in FIG. 6, extends perpendicular to the drawing plane in a horizontal direction, and in FIG. 7, extends in the drawing plane.

The enclosure 115 includes a first layer 116 and a second layer 117 that are arranged parallel to the virtual surface. The substrates 101, 102 are arranged between the first layer 116 and the second layer 117. The first layer 116 has a first edge, and the second layer 117 has a second edge. The first edge and the second edge are joined together and form a combined edge 118. The substrates 101, 102 likewise have lateral edges that in a maximum displacement position touch a combined edge 108 of the enclosure 115. The combined edge 118 thereby restricts a possible displacement of the substrates tangential to the virtual surface. In the situation shown, the substrate 101 is displaced to a maximum extent to the right, and the substrate 102 is displaced to a maximum extent to the left.

A substrate may have a different number of conductor loops, as shown in FIG. 11. This figure shows examples in which a substrate 101 has between one and four conductor loops. Bundling three conductor loops on one substrate may be advantageous.

A rigid region for an electronics unit 130 (e.g., an electronics interface) is located in a center of the grouping of conductor loops or at the edge, in the case of just one conductor loop.

Signals from the electronics unit 130 may be transferred, for example, from substrate to substrate and bundled internally, or fed individually out of substrates and bundled externally.

Figure 8:
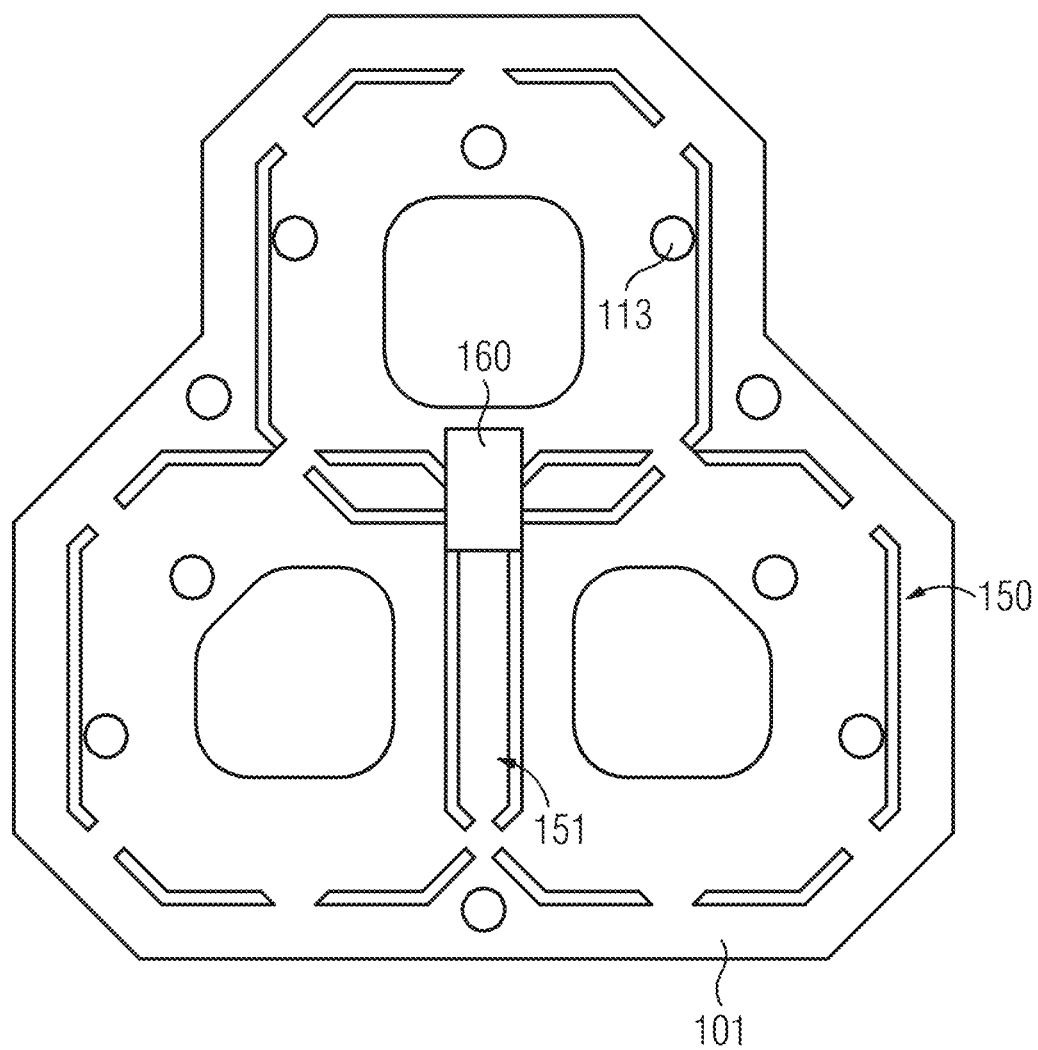
FIG. 8 shows one embodiment of a substrate having three electrical conductor loops.
Figure 9:
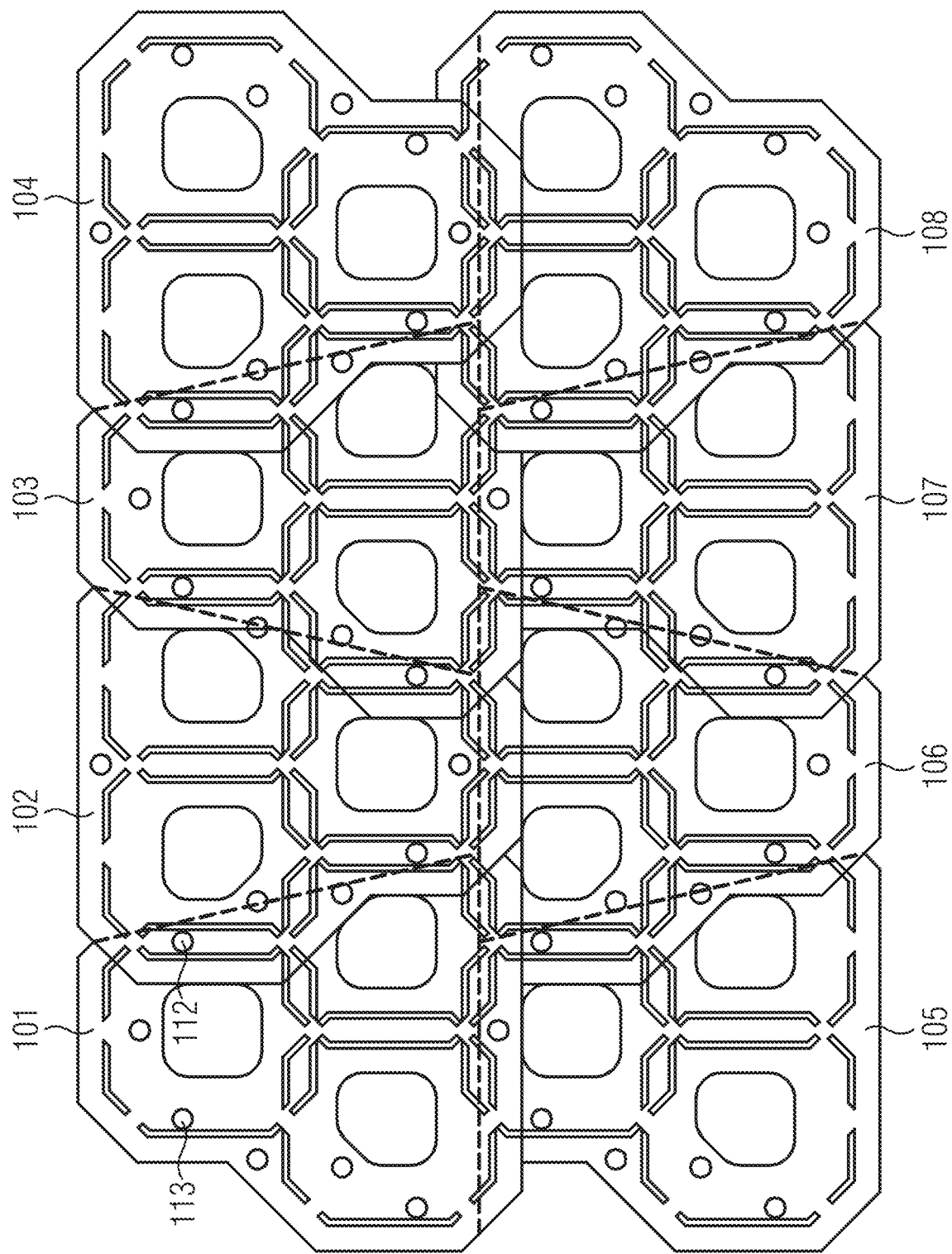
FIGS. 9 and 10 show one embodiment of an array including eight substrates having three electrical conductor loops.

FIG. 8 shows, by way of example a substrate 101 having three conductor loops 150 and an electronics unit 160. An MR local coil may include, for example, eight of such substrates 101, 102, 103, 104, 105, 106, 107, 108 by combining the substrates in an 8×3 coil array, as shown in FIG. 9. The eight substrates 101, 102, 103, 104, 105, 106, 107, 108 all have the same shape.

Movable regions or overlaps of the conductor loops are located in the regions indicated by the dashed lines. In addition, fixed overlaps 151 are also possible within a substrate, as is shown in FIG. 8.

Figure 10:
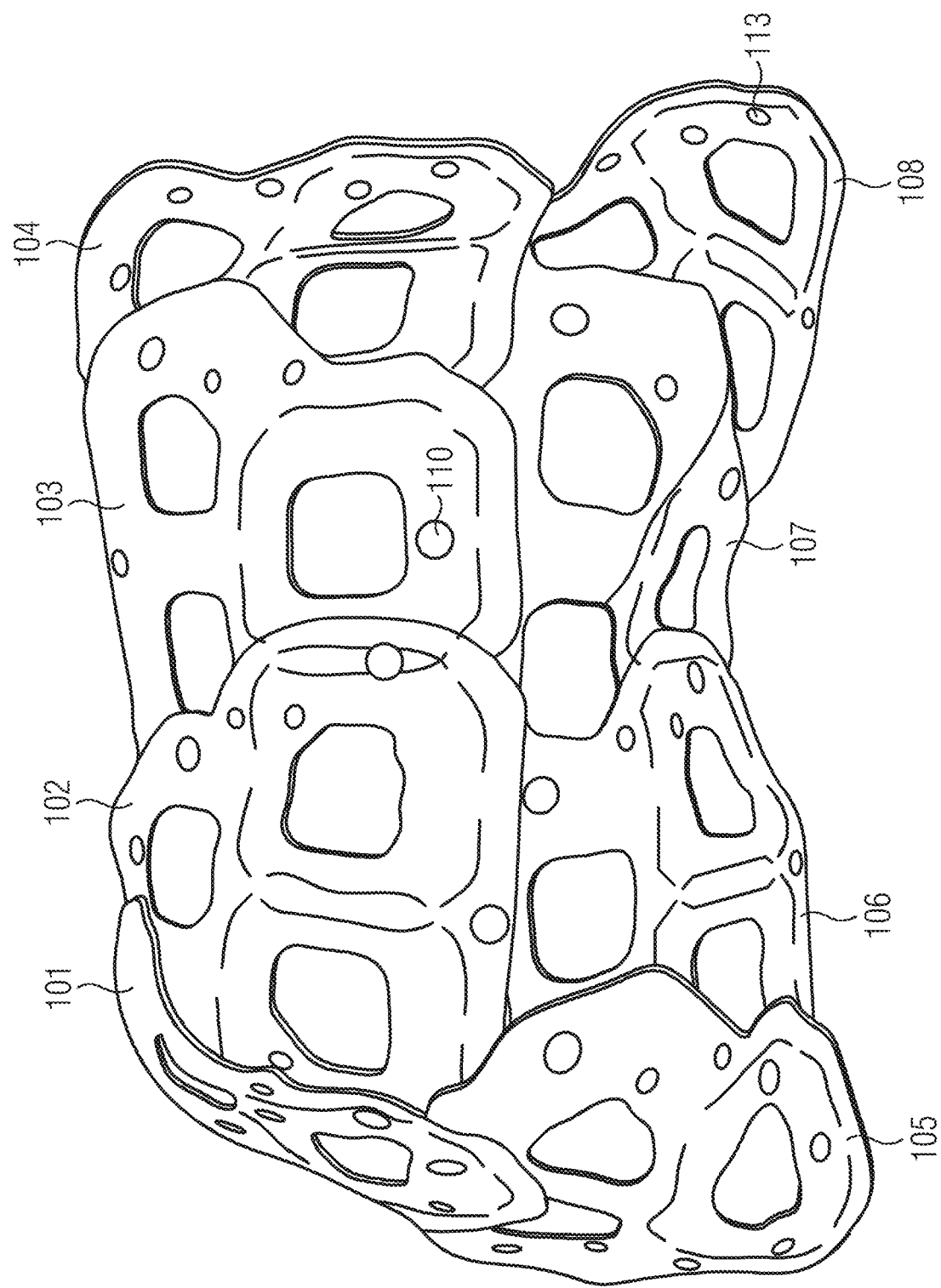

FIG. 10 shows one embodiment of an arrangement of substrates 101, 102, 103, 104, 105, 106, 107, 108 that is form-fitted to a three-dimensional body. The substrates 101, 102, 103, 104, 105, 106, 107, 108 of the arrangement are connected by connecting devices that serve at the same time as a mechanism 110 for restricting tangential displacement.

The MR local coils described in detail above are merely exemplary embodiments that may be modified by a person skilled in the art in many ways without departing from the scope of the invention. In addition, the use of the indefinite article "a" or "an" does not rule out the possibility of there also being more than one of the features concerned. Likewise, the term "unit" does not exclude the possibility that the components in question consist of a plurality of interacting sub-components that may also be spatially distributed if applicable.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance (MR) local coil comprising:
   a plurality of substrates that form a combined virtual surface, the plurality of substrates being overlapping at least partially;
   at least one conductor loop arranged on each substrate of the plurality of substrates; and
   an enclosure that surrounds the plurality of substrates at least partially, such that the plurality of substrates and overlapping portions thereof are arranged inside the enclosure, wherein the enclosure comprises an aperture that corresponds to openings in respective adjacent and overlapping substrates of the plurality of substrates,
   wherein the MR local coil is configured to allow a displacement of the plurality of substrates with respect to one another tangential to the virtual surface.

2. The MR local coil of claim 1, wherein at least one substrate of the plurality of substrates comprises two or more conductor loops.

3. The MR local coil of claim 1, wherein the plurality of substrates, the conductor loops, or the plurality of substrates and the conductor loops are bendable.

4. The MR local coil of claim 1, wherein the plurality of substrates comprise a printed circuit board material.

5. The MR local coil of claim 1, further comprising a mechanism configured to restrict a possible displacement of the plurality of substrates with respect to one another tangential to the virtual surface.

6. The MR local coil of claim 5, wherein adjacent substrates of the plurality of substrates are connected by at least one connecting device, the at least one connecting device restricting the possible displacement of the plurality of substrates with respect to one another tangential to the virtual surface.

7. The MR local coil of claim 6, wherein the at least one connecting device comprises a connecting element that is fed through openings in respective adjacent substrates of the plurality of substrates.

8. The MR local coil of claim 7, wherein at least one of the openings has a larger dimension in a first direction tangential to the virtual surface than in a direction that is orthogonal to the first direction and tangential to the virtual surface.

9. The MR local coil of claim 1, wherein the enclosure restricts a possible displacement of the plurality of substrates with respect to one another tangential to the virtual surface.

10. The MR local coil of claim 9, wherein the enclosure comprises a first layer and a second layer,
wherein the first layer and the second layer are arranged parallel to the virtual surface,
wherein the plurality of substrates are arranged between the first layer and the second layer,
wherein the first layer has a first edge, and the second layer has a second edge,
wherein the first edge and the second edge are joined together and form a combined edge, and
wherein the combined edge restricts the possible displacement of the plurality of substrates with respect to one another tangential to the virtual surface.

11. The MR local coil of claim 1, wherein projections of the plurality of substrates onto the virtual surface overlap at least partially.

12. The MR local coil of claim 11, wherein projections of the conductor loops onto the virtual surface overlap at least partially.

13. The MR local coil of claim 11, wherein the plurality of substrates are aligned parallel to one another in an overlap region of the projections of the plurality of substrates onto the virtual surface.

14. The MR local coil of claim 1, wherein at least two substrates of the plurality of substrates have a same shape.

15. The MR local coil of claim 1, wherein an electronics unit is arranged on at least some substrates of the plurality of substrates.

16. A magnetic resonance apparatus comprising:
at least one magnetic resonance (MR) local coil, each MR local coil of the at least one MR local coil comprising:
a plurality of substrates that form a combined virtual surface, the plurality of substrates being overlapping at least partially;
at least one conductor loop arranged on each substrate of the plurality of substrates; and
an enclosure that surrounds the plurality of substrates at least partially, such that the plurality of substrates and overlapping portions thereof are arranged inside the enclosure, wherein the enclosure comprises an aperture that corresponds to openings in respective adjacent and overlapping substrates of the plurality of substrates,
wherein the respective MR local coil is configured to allow a displacement of the respective plurality of substrates with respect to one another tangential to the virtual surface.

17. The MR local coil of claim 10, wherein the combined edge forms a boundary of the aperture.

* * * * *